(12) United States Patent
Almeida Loya et al.

(10) Patent No.: US 10,392,243 B2
(45) Date of Patent: Aug. 27, 2019

(54) COUPLED MEMRISTOR DEVICES TO ENABLE FEEDBACK CONTROL AND SENSING OF MICRO/NANOELECTROMECHANICAL ACTUATOR AND SENSORS

(71) Applicants: Board of Regents, The University of Texas System, Austin, TX (US); National Technology & Engineering Solutions of Sandia, LLC, Albuquerque, NM (US)

(72) Inventors: Sergio Fabian Almeida Loya, Chihuahua (MX); David Zubia, El Paso, TX (US); Ernest J. Garcia, Albuquerque, NM (US); Jose Mireles, Jr., Chihuahua (MX)

(73) Assignees: Board of Regents, The University of Texas System, Austin, TX (US); National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/516,322

(22) PCT Filed: Oct. 1, 2015

(86) PCT No.: PCT/US2015/053441
§ 371 (c)(1),
(2) Date: Mar. 31, 2017

(87) PCT Pub. No.: WO2016/054340
PCT Pub. Date: Apr. 7, 2016

(65) Prior Publication Data
US 2017/0297908 A1    Oct. 19, 2017

Related U.S. Application Data

(60) Provisional application No. 62/058,698, filed on Oct. 2, 2014.

(51) Int. Cl.
*B81B 7/02* (2006.01)
*G01P 15/125* (2006.01)
*B81B 7/00* (2006.01)

(52) U.S. Cl.
CPC ............... *B81B 7/02* (2013.01); *B81B 7/008* (2013.01); *B81B 7/0087* (2013.01);
(Continued)

(58) Field of Classification Search
CPC ......... B81B 7/02; B81B 7/008; B81B 7/0087; G01P 15/125
(Continued)

(56) References Cited

U.S. PATENT DOCUMENTS 7,846,807 B2    12/2010    Tang et al.
7,898,844 B2    3/2011    Wang et al.
(Continued)

OTHER PUBLICATIONS

Almeida Loya, Sergio Fabian. "Integration of memristors with MEMS for dynamic displacement control". (Jan. 1, 2013). ETD Collection for University of Texas, El Paso. AAI3611240.*
(Continued)

*Primary Examiner* — Tarun Sinha
(74) *Attorney, Agent, or Firm* — Yee & Associates, P.C.

(57) ABSTRACT

A MEMS apparatus with dynamic displacement control includes a MEMS parallel plate capacitor integrated with one or more memristors in a series configuration wherein a displacement is observable as a function of memristance, such that an upper electrode position is capable of being interpreted in a form of a resistance rather than a capacitance. The current is limited by said MEMS parallel plate capacitor restricting a change in the resistance of the memristor(s). The memristor(s) can be employed in some embodiments a sensor element to improve a MEMS operation range.

20 Claims, 8 Drawing Sheets

(52) U.S. Cl.
CPC .... *G01P 15/125* (2013.01); *B81B 2201/0235* (2013.01); *B81B 2201/0242* (2013.01)

(58) Field of Classification Search
USPC ...................................................... 73/514.16
See application file for complete search history.

(56) References Cited

U.S. PATENT DOCUMENTS

| | | | |
|---|---|---|---|
| 7,902,867 | B2 | 3/2011 | Mouttet |
| 8,249,838 | B2 | 8/2012 | Pino et al. |
| 8,274,312 | B2 | 9/2012 | Pino et al. |
| 8,416,604 | B2 | 4/2013 | Kim et al. |
| 8,427,203 | B2 | 4/2013 | Pino et al. |
| 8,431,921 | B2 | 4/2013 | Pickett et al. |
| 8,433,665 | B2 | 4/2013 | Tang et al. |
| 8,445,884 | B2 | 5/2013 | Xia et al. |
| 8,450,711 | B2 | 5/2013 | Williams et al. |
| 2005/0275455 | A1* | 12/2005 | DeGeronimo ............ H03F 1/34 330/109 |
| 2009/0007662 | A1* | 1/2009 | Sung ....................... G01C 19/56 73/504.12 |
| 2009/0278610 | A1* | 11/2009 | Murji ........................ H03F 1/52 330/298 |
| 2011/0279135 | A1 | 11/2011 | Borghetti et al. |
| 2011/0285309 | A1 | 11/2011 | Van De Ven |
| 2012/0026776 | A1 | 2/2012 | Yang et al. |
| 2012/0120714 | A1 | 5/2012 | Yang et al. |
| 2012/0127780 | A1 | 5/2012 | Strachan et al. |
| 2012/0194967 | A1 | 8/2012 | Keane et al. |
| 2014/0361851 | A1 | 12/2014 | Keane et al. |
| 2016/0248007 | A1 | 8/2016 | Hersam et al. |
| 2016/0254448 | A1 | 9/2016 | Choi et al. |
| 2017/0062048 | A1 | 3/2017 | Ge et al. |
| 2017/0077179 | A1 | 3/2017 | Yang et al. |

OTHER PUBLICATIONS

Almeida, S. et al., Integration of memristors with MEMS in different circuit configurations, NSTI-Nanotech (2015) 2:532-535.
Loya, S. F. A., Integration of memristors with MEMS for dynamic displacement control, ETD Collection for University of Texas, El Paso, paper AAI3611240, Jan. 1, 2013, 1 page.
Zubia, D. et al., SnO2-Based Memristors and the Potential Synergies of Integrating Memristors with MEMS, Proc. SPIE 8373, Micro- and Nanotechnology Sensors, Systems, and Applications IV, 83731V, May 7, 2012, 10 pages.
Lu, M. S.-C. et al., Position Control of Parallel-Plate Microactuators for Probe-Based Data Storage, Journal of Microelectromechanical Systems (2004) 13(5):759-769.
How an npn Bipolar Junction Transistor (BJT) works, http://macao.communications.museum/eng/exhibition/secondfloor/moreinfo/2_10_3_howtransistorworks.html, printed Apr. 4, 2017, 2 pages.
Mazumder, P. et al., Memristors: Devices, Models, and Applications, Proceedings of the IEEE (2012) 100(6):1911-1919.
Mickel, P. R. et al., A physical model of switching dynamics in tantalum oxide memristive devices, Applied Physics Letters (2013) 102:223502, 5 pages.
Nagashma, K. et al., Unipolar resistive switching characteristics of room temperature grown SnO2 thin films, Applied Physics Letters (2009) 94:242902, 3 pages.
Peng, H. et al., Nonvolatile resistive switching in spinel $ZnMn_2O_4$ and ilmenite $ZnMnO_3$, Applied Physics Letters (2009) 95:152106, 3 pages.
Perreault, J. A. et al., Adaptive optic correction using microelectromechanical deformable mirrors, Opt. Eng. (2102) 41(3):561-566.
Pershin, Y. V. et al., Memristive model of amoeba's learning, Nature Precedings (2008) http://hdl.handle.net/10101/npre.2008.2431.1, 6 pages.

Pickett, M. D. et al., Switching dynamics in titanium dioxide memristive devices, Journal of Applied Physics (2009) 106:074508, 7 pages.
Prodromakis, T. et al., A Versatile Memristive Model with Nonlinear Dopant Kinetics, IEEE Transactions on Electron Devices (2011) 58(9):3099-3105.
Rebeiz, G. M. et al., RF MEMS Switches and Switch Cicruits, IEEE Microwave Magazine Dec. 2001, pp. 59-71.
Saucedo-Flores, E. et al., Study of the Pull-In Voltage for MEMS Parallel Plate Capacitor Actuators, 2003 MRS Materials Research Society Fall Meeting, Boston, Dec. 1-5, 7 pages.
Sawa, A. et al., Resistive switching on transition metal oxides, Materials Today (2008) 11(6):28-36.
Seeger, J. I. et al., Charge Control of Parallel-Plate, Electrostatic Actuators and the Tip-In Instability, Journal of Microelectromechanical Systems (2003) 12(5):656-671.
Seo, J. W. et al., Transparent flexible resistive random access memory fabricated at room temperature, Applied Physics Letters (2009) 95:133508, 3 pages.
Simmons, J. G., Electric Tunnel Effect between Dissimilar Electrodes Separated by a Thin Insulating Film, Journal of Applied Physics (1963) 34(9):2581-2590.
Stewart, D. R. et al., Molecule-Independent Electrical Switching in Pt/Organic Monolayer/Ti Devices, Nano Letters (2004) 4(1):133-136.
Strukov, D. B. et al., The missing memristor found, Nature (2008) 453:80-83.
Strukov, D. B. et al., Exponential ionic drift: fast switching and low volatility of thin-film memristors, Applied Physics A (2009) 94:515-519.
Sun, Y. et al., MEMS capacitive force sensors for cellular and flight biomechanics, Biomedical Materials (2007) 2:S16-S22.
Trusov, A. A. et al., Capacitive detection in resonant MEMS with arbitrary amplitude of motion, Journal of Micromechanics and Microengineering (2007) 17:1583-1592.
Wang, S.-Y. et al., Effects of Ti top electrode thickness on the resistive switching behaviors of rf-sputtered $ZrO_2$ memory films, Applied Physics Letters (2009) 95:112904, 3 pages.
Waser, R. et al., Nanoionics-based resistive switching memories, Nature Materials (2007) 6:833-840.
Williams, R. S., How We Found the Missing Memristor, IEEE Spectrum Dec. 2008, pp. 29-35.
Xiao-Bo, T. et al., The conductive mechanisms of a titanium oxide memristor with dopant drift and a tunnel barrier, Chin. Phys. B. (2013) 22(8):086502-1-088502-9.
Yang, J. J. et al., Memristive switching mechanism for metal/oxide/metal nanodevices, Nature Nanotechnology (2008) 3:429-433.
Yang, M. K. et al., Bipolar resistive switching behavior in $Ti/MnO_2/Pt$ structure for nonvolatile memory devices, Applied Physics Letters (2009) 95:042105, 3 pages.
Yang, Y. et al., Observation of conducting filament growth in nanoscale resistive memories, Nature Communications (2012) 3:732, 8 pages.
Yao, J. J., RF MEMS from a device perspective, J. Micromech. Microeng. (2000) 10:R9-R38.
Yeow, T.-W. et al., MEMS Optical Switches, IEEE Communications Magazine (2001) 39(11):158-163.
Zhu. G. et al., Improving the Performance of an Electrostatically Actuated MEMS by Nonlinear Control: Some Advances and Comparisons, Proceedings of the 44th IEEE Conference on Decision and Control, and the European Control Conference (2005) Seville, Spain, Dec. 12-15, 6 pages.
Zhu, G. et al., Robust Control of an Electrostatically Actuated MEMS in the Presence of Parasitics and Parametric Uncertainties, Proceedings of the 2006 American Control Conference, Minneapolis, MN, Jun. 14-16, 6 pages.
Zhu, G. et al., Robust Output Feedbad Control of an Electrostatic Micro-Actuator, Proceedings of the 2007 American Control Conference, Marriott Marquis Hotel at Time Square, New York City, Jul. 11-13, 6 pages.
Zougagh, M. et al., Micro-electromechanical sensors in the analytical field, Analyst (2009) 134:1274-1290.

(56) References Cited

OTHER PUBLICATIONS

Zubia, D. et al., SnO₂-Based Memristors and the Potential Synergies of Integrating Memristors with MEMS, Micro- and Nanotechnology Sensors, Systems, and Applications IV, Proc. of SPIE, vol. 8373, George, T. et al., (eds.), 10 pages.
Abdalla, H. et al., SPICE Modeling Memristors, 2011 IEEE International Symposium on Conference: Circuits and Systems (ISCAS), 4 pages.
Almeida Loya, S. F., Resistive Switching of Tin Dioxide (SnO2) for Memristor Applications, Thesis, Aug. 2010, 78 pages.
Almeida, S. et al., Resistive Switching of SnO2 Thin Films on Glass Substrates, Integrated Ferroelectrics (2011) 126(1):117-124.
Almeida, S. F. et al., Integration of memristors with MEMS in different circuit configurations, NSTI-Nanotech (2013) 2:532-535.
Anderson, R. C. et al., Integrated charge and position sensing for feedback control of electrostatic MEMS, Smart Structures and Materials 2005: Sensors and Smart Structures Technologies for Civil, Mechanical, and Aerospace Systems, 42 (Jun. 3, 2005), 12 pages.
Bao, M., Analysis and Design Principles of MEMS Devices, Elsevier (2005) title page.
Bao, B.C. et al., Steady periodic memristor oscillator with transient chaotic behaviours, Electronic Letters (2010) 46(3):237-238.
Beliveau, A. et al., Evaluation of MEMS Capacitive Accelerometers, IEEE Design & Test of Computers (1999) 16(4):48-56.
Berdan, R. et al., Memristive devices as parameter setting elements in programmable gain amplifiers, Applied Physics Letters (2012) 101:243502, 4 pages.
Biolek, Z. et al., SPICE Model of Memristor with Nonlinear Dopant Drift, Radioengineering (2009) 18(2):210-214.
Bipolar junction transistor—Wikipedia, printed Apr. 4, 2017, 12 pages.
Borghetti, J. et al., A hybrid nanomemristor/transistor logic circuit capable of self-programming, PNAS (2009) 106(6):1699-1703.
Boylestad, R. L. et al., Electronic Devices and Circuit Theory (2003) Prentice Hall, Upper Saddle River, New Jersy, title page.
Boylestad, R. L. et al., Electronic Devices and Circuit Theory (2009) Pearson Education, Inc. Upper Saddle River, NJ, 186 pages.
Brosnihan, T.J. et al., Optical Imems(R)—A Fabrication Process for MEMS Optical Switches with Integrated On-chip Electronics, The 12th International Conference on Solid State Sensors, Actuators and Microsystems (2003) Boston, Jun. 8-12, pp. 1638-1642.
Bryzek, J. et al., Control Issues for MEMS, Proceedings of the 42nd IEEE Conference o Decision and Control (2003) Maui, Hawaii, December, pp. 3039-3047.
Bryzek, J., Emergence of a $Trillion MEMS Sensor Market, SensorCon 2012, Fairchild Semiconductor, 22 pages.
Brigham Young University, http://www.cleanroom.byu.edu/MOSFET_calc.parts/14.jpg, printed Apr. 4, 2017, 1 page.
Chan, E. K. et al., Electrostatic Micromechanical Actuator with Extended Range of Travel, Journal of Microelectromechanical Systems (2000) 9(3):321-328.
Chan, M.Y. et al., Resistive switching effects of HfO2 high-k dielectric, Microelectronic Engineering (2008) 85:2420-2424.
Chau, K.H.-L. et al., An integrated force-balance capacitive accelerometer for low-g applications, Sensors and Actuators A (1996) 54:472-476.
Chavan, A. V. et al., Batch-Processed Vacuum-Sealed Capacitive Pressure Sensors, Journal of Microelectromechanical Systems (2001) 10(4):580-588.
Chu, P. B. et al., Analysis of Closed-loop Control of Parallel-Plate Electrostatic MicroGrippers, IEEE International Conference on Robotics and Automation (1994) May 8-13, pp. 820-825.
Chua, L. O., Memristor—The Missing Circuit Element, IEEE Transactions on Circuit Theory (1971) CT-18(5):507-519.
Chua, L. O., The Fourth Element, Proceedings of the IEEE (2012) 100(6):1920-1927.
Dadap, J. I. et al., Modular Mems-Based Optical Cross-Connect with Larger Port-Count, IEEE Photonics Technology Letters (2003) 15(12):1773-1775.

Dec, A. et al., Microwave MEMS-Based Voltage-Controlled Oscillators, IEEE Transactions on Microwave Theory and Techniques (2000) 48(11):1943-1949.
Dias, R. A. et al., Closed-loop operated time-based accelerometer, Procedia Engineering (2012) 47:398-401.
Do, Y. H. et al., Hysteretic bipolar resistive switching characteristics in TiO2/TiO2-x multilayer homojunctions, Applied Physics Letters (2009) 95:093507, 3 pages.
Dong, L., Closed-loop Voltage Control of a Parallel-plate MEMS Electrostatic Actuator, 2010 American Control Conference, Marriott Waterfront, Baltimore, MD, Jun. 30-Jul. 2, pp. 3409-3414.
Franco, S., Design with Operational Amplifiers and Analog Integrated Circuits (2002) McGraw-Hill, New York, NY, 334 pages.
Fuller, L., BJT Amplifiers, Rochester Institute of Technology, Microelectronic Engineering, http://people.rit.edu/lffeee/BJT_Amplifiers.pdf, 57pages, Jan. 24, 2017.
Gao, L. et al., Digital-to-Analog and Analog-to-Digital Conversion with Metal Oxide Memristors for Ultra-Low Power Computing, Proceedings of the 2013 IEEE/ACM International Symposium on Nanoscale Architectures, New York, NY, Jul. 15-17, pp. 19-22.
Greywall, D. S. et al., Crystalline Silicon Tilting Mirrors for Optical Cross-Connect Switches, Journal of Microelectromechanical Systems (2003) 12(5):708-712.
Hah, D. et al., Low-Voltage, Large-Scan Angle MEMS Analog Micromirror Arrays with Hidden Vertical Comb-Drive Actuators, Journal of Microelectromechanical Systems (2004) 13(2):279-289.
Hofmann, U. et al., Resonant biaxial 7-mm MEMS mirror for omnidirectional scanning, Proc. of SPIE 8616 MOEMS and Miniaturized Systems XII (2013) 86160C, 14 pages.
Joglekar, Y. N. et al., The elusive memristor: properties of basic electrical circuits, European Journal of Physics (2009) 30:661-675.
Juneau, T. et al., Dual-Axis Optical Mirror Positioning Using a Nonlinear Closed-Loop Controller, The 12th International Conference on Solid State Sensors, Actuators and Microsystems (2003) Boston, Jun. 8-12, pp. 560-563.
Kaiser, A., The potential of MEMS components for re-configurable RF interfaces in mobile communication terminals, Proceedings of the 27th European Solid-State Circuits Conference (2001) Sep. 18-20, 4 pages.
Kang, S. M. et al., CMOS Digital Integrated Circuits, McGraw-Hill, New York, NY, 2003, 3rd edition, 58 pages.
Kang, S. O. et al., Electrochemical growth and resistive switching of flat-surfaced and (111)-oriented Cu2O films, Applied Physics Letters (2009) 95:092108, 3 pages.
Kim, H. et al., Memristor Emulator for Memristor Circuit Appilcatins, IEEE Transactions on Circuits and Systems—I: Regular Papers (2012) 59(10):2422-2431.
Kozma, R. et al. (eds.), Are Memristors the Future of AI? A Review of Recent Progress and Future Perspectives, Advances in Neuromorphic Memristor Science and Applications (2012) Springer Science+Business Media Dordrecht, pp. 9-14.
Kvatinsky, S. et al., TEAM: ThrEshold Adaptive Memristor Model, IEEE Transactions on Circuits and Systems—I: Regular Papers (2013) 60(1):211-221.
Langfelder, G. et al., Readout of MEMS capacitive sensors beyond the condition of pull-in instability, Sensors and Actuators A: Physical, (2011) 167:374-384.
Lee, S.-S. et al., Surface-Micromachine Free-Space Fiber Optic Switches with Integrated Microactuators for Optical Fiber Communication Systems, Transducers '97, 1997 International Conference on Solid-State Sensors and Actuators, Chicago, Jun. 16-19, pp. 85-88.
Lee, S. et al., Resistive switching characteristics of ZnO thin film grown on stainless steel for flexible nonvolatile memory devices, Applied Physics Letters (2009) 95:262113, 3 pages.
Leland, R. P., Adaptive Control of a MEMS Gyroscope Using Lyapunov Methods, IEEE Transactions on Control Systems Technology (2006) 14(2):278-283.
Lin, L. Y. et al., Opportunities and Challenges for MEMS in Lightwave Communications, IEEE Journal on Selected Topics in Quantum Electronics (2002) 8(1):163-172.

(56) References Cited

OTHER PUBLICATIONS

Linares-Barranco, B. et al., Memristance can explain Spike-Time-Dependent-Plasticity in Neural Synapses, Nature Precedings Sep. 2010, 4 pages.

\* cited by examiner

US 10,392,243 B2

COUPLED MEMRISTOR DEVICES TO ENABLE FEEDBACK CONTROL AND SENSING OF MICRO/NANOELECTROMECHANICAL ACTUATOR AND SENSORS

CROSS REFERENCE TO RELATED APPLICATIONS

This application is the U.S. national phase of International Application No. PCT/US/2015/053441, filed on Oct. 1, 2015 under the PCT (Patent Cooperation Treaty), and claims priority to U.S. Provisional Patent Application No. 62/058,698, filed Oct. 2, 2014. The entire contents of these applications are incorporated herein by reference.

GOVERNMENT RIGHTS

This invention was developed under a commercialization agreement between the University of Texas El Paso at El Paso (UTEP) on behalf of The University of Texas System Board of Regents, and Sandia Corporation, manager and operator of Sandia National Laboratories for the U.S. Department of Energy under Contract No. DE-AC04-94AL85000 between Sandia Corporation and the U.S. Department of Energy. The U.S. Government therefore has certain rights in this invention pursuant to Contract No. DE-AC04-94AL85000.

TECHNICAL FIELD

Embodiments are related to MEMS (Microelectromechanical Systems) devices and components. Embodiments also relate to micro/nanoelectromechanical devices and systems such as actuators and sensors. Embodiments additionally relate to memristors and related devices and components.

BACKGROUND

In recent years, the demand for high-speed, lower power consumption and large-capacity non-volatile memories has increased. Promisingly the memristor can be used due to its special characteristic of having memory through resistance change. The memristor behavior is not limited to digital applications, but it can be used in analog application as well including: memristors in chaotic circuits, amoeba's learning, neural synaptic emulation, reprogrammable and reconfigurable circuits, and for neuromorphic computers. On the other hand, Micro Electro Mechanical Systems (MEMS) are small scale structures that can interact with the physical world due to their mechanical properties. These devices are widely used in diverse applications such as: accelerometers, pressure sensors, micro-optics, biosensors, tilting mirrors, and RF switches. One of the most common MEMS devices is the electrostatic actuator which moves a metal electrode when a voltage is applied; however, these actuators are limited to one third of its gap. The purpose of this work is to investigate the potential of the integration of these two devices and extend the application branch of the memristor.

Microelectromechanical System (MEMS) devices have wide application for sensing and actuation. One of the most common and versatile MEMS devices are parallel plate capacitors. For example, they are used as accelerometers in automobiles for airbag deployment and gyroscopes for mobile smartphones. The device is composed of two electrodes (upper and bottom) separated by a gap.

When a voltage is applied across the bottom and upper electrodes, an attractive electrostatic force will move the upper electrode (which is free to move) towards the bottom electrode (which is fixed). However when the separation between electrodes is reduced to less than $\frac{2}{3}$ of the original gap, an unstable situation occurs which causes the upper electrode to collapse with the bottom electrode. This effectively reduces the operating range of the capacitor to $\frac{1}{3}$ of the possible motion. If the position of the upper electrode could be sensed, that signal could be used in a closed-looped control circuit to dynamically control the position and extend the operating to 95% of the full range of motion. However, the main issue with closed-loop control is the lack of a suitable method for sensing the position of the upper electrode.

On the other hand, memristor-like devices can be employed in different applications including digital and analog electronics. Within these applications are high-density non-volatile memories, neural synaptic emulation, and neuromorphic computers. The device consist of two electrodes separated by an insulator. When a voltage is applied across the electrodes, the resistance in the insulator changes. Due to this behavior the memristor can be used in diverse applications, however, the integration of this device with other circuit element is still under development. This invention employs the memristor in a new application, where this device is integrated with the MEMS capacitor in closed-loop control system to accurately sense the position of the upper electrode. This will extend the MEMS operating range to 95% for a wider range of sensing and actuation applications.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved MEMS apparatus or system.

It is another aspect of the disclosed embodiments to provide for the use of coupled memristor devices for enabling feedback control and sensing of micro/nanoelectromechanical actuators and sensors.

It is yet another aspect of the disclosed embodiments to provide for the integration of memristors with MEMS for dynamic displacement control.

The aforementioned aspects and other objectives and advantages can now be achieved as described herein. The disclosed methods and systems include the integration of a MEMS parallel plate capacitor and a memristor in a series circuit configuration, wherein the displacement is a function of the memristance, such that the upper electrode position can be interpreted in the form of resistance instead of capacitance. The memristor can sense the MEMS dynamics for different applications. The current in this configuration is limited by the MEMS restricting the change in the resistance of the memristor. To overcome this disadvantage, different amplification stages are investigated to maximize the charge interaction between both devices using a BJT amplification, a MOSFET amplification, and an Op Amp stage.

The memristor can be utilized in some embodiments as a sensor element for MEMS displacement and in a simple design for a voltage closed-loop control in order to improve the MEMS operation range. It can be shown that the MEMS upper plate can be stabilized up to 95% of the total gap with low power consumption. Thus, such a memristor can play an important role overcoming the limited operation range of the MEMS actuators.

Note that as utilized herein, the term MEMS can refer not only to microelectromechanical devices and methods, but also to micro/nanoelectromechanical systems, devices, and associated methods.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
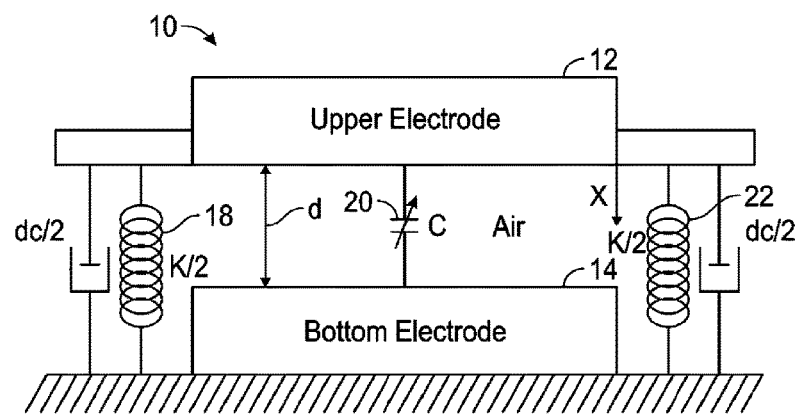
FIG. 1 illustrates a schematic diagram of the structure of a MEMS parallel plate capacitor, which can be implemented in accordance with an example embodiment.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In an example embodiment, a memristor can be integrated with a MEMS capacitor in a closed-loop control system to accurately sense a position of an upper electrode. This configuration can be utilized to extend the MEMS operating range to 95% for a wider range of sensing and actuation applications. The memristor is arranged in a configuration using at least one coupled memristor device to enable feedback control and sensing of micro/nanoelectromechinical actuators and sensors. A MEMS parallel plate capacitor is integrated with the memristor in a simple series circuit configuration where it is possible to observe that the displacement can be a function of the memristance giving the possibility of interpreting the upper electrode position in form of resistance instead of capacitance.

Thus, the memristor has the potential to sense the MEMS dynamics for different applications. The current in this configuration is limited by the MEMS restricting the change in the resistance of the memristor. To overcome this disadvantage, different amplification stages are investigated to maximize the charge interaction between both devices using a BJT amplification, a MOSFET amplification, and an Op Amp stage.

The disclosed memristor can be utilized as a sensor element for the MEMS displacement in a simple design for a voltage closed-loop control in order to improve the MEMS operation range. In the final control design, it is shown that the MEMS upper plate can be stabilized up to 95% of the total gap with low power consumption. Thus, the memristor can play an important role overcoming the limited operation range of the MEMS actuators.

FIG. 1 illustrates a schematic diagram of the structure of a MEMS parallel plate capacitor 10, which can be implemented in accordance with an example embodiment. As shown in FIG. 1, the MEMS parallel plate capacitor 10 is composed of an upper electrode 12, a bottom electrode 14, and a MEMS capacitor 20. The upper electrode 12 is separated from the bottom electrode 14 by a distance d as shown in FIG. 1. That is, the variable d represents the distance between the respective upper electrode/plates 12, 14. The variable k shown in FIG. 1 represents a spring constant, and $d_c$ (or dc) represents a damping constant. The variable x represents the displacement of the upper electrode 12. Note that "air" as shown in FIG. 1 functions as a dielectric medium.

The MEMS parallel plate capacitor 10 offers a versatile structure due to its simple structure and the variety of available fabrication techniques that can be employed to construct it. Potential applications for a MEMS component such as the MEMS parallel plate capacitor include, but are not limited to, for example, microgrippers, micro-relays, gyro sensors, micromotors, cantilevers, optical shutters, optical attenuators, and micromirrors to name a few. Other applications include the use of MEMS parallel plate capacitor 10 in the context of a capacitive MEMS RF switch or a voltage controlled oscillator. The basic physical structure of MEMS parallel plate capacitor 10 includes two metal plates or electrodes 12, 14 separated by an air gap (i.e., "air" as shown in FIG. 1).

When a voltage is applied across the respective bottom and the upper electrodes 14, 12, an attractive electrostatic force will move the upper electrode 12 (which is free to move) towards the bottom electrode 14 (which is fixed). However, mechanical forces due to the physical characteristic of the MEMS will oppose this motion, depending on the MEMS design. These forces can include, for example, the opposition force of the upper electrode to be deformed, which is represented by a spring force where the spring constant (k) depends on the electrode material and MEMS design, the inertia force due to the mass of the moving electrode, and a damping force which depends on the media between the two electrodes 12, 14.

Taking in consideration all the forces mentioned above the dynamic behavior of the MEMS is given by the nonlinear Equation (1) shown below. The left side of the equation contains all the mechanical forces and the right side contains the electrostatic force given by Coulomb's law.

$$m\frac{d^2x}{dt^2} + d_c\frac{dx}{dt} + kx = \frac{\varepsilon_0 A V_{MEMS}^2}{2(d-x)^2} \qquad (1)$$

From this equation, the displacement of the upper electrode x can be manipulated by applying a voltage, $V_{MEMS}$. At steady state, the acceleration and velocity of the upper electrode 12 becomes zero and Equation (1) above will be reduced by Equation (2) below.

$$\frac{\varepsilon_0 A V_{MEMS}^2}{2(d-x)} - kx = F_e(x) - F_s(x) = 0 \qquad (2)$$

At this point a force balance can be achieved between the mechanical force ($F_s$) and the electrostatic force ($F_e$). $F_s$ tends to return the upper electrode 12 to its initial position and $F_e$ is the attraction between the electrodes due to the applied voltage. $F_s$ is due to the MEMS spring 18, 22 and has a linear behavior with respect to the upper plate position, whereas $F_e$ has a parabola-like behavior. This implies that the steady-state can be achieved at two points as shown in the graphical solution depicted in graph 28 of FIG. 2.

Figure 2:
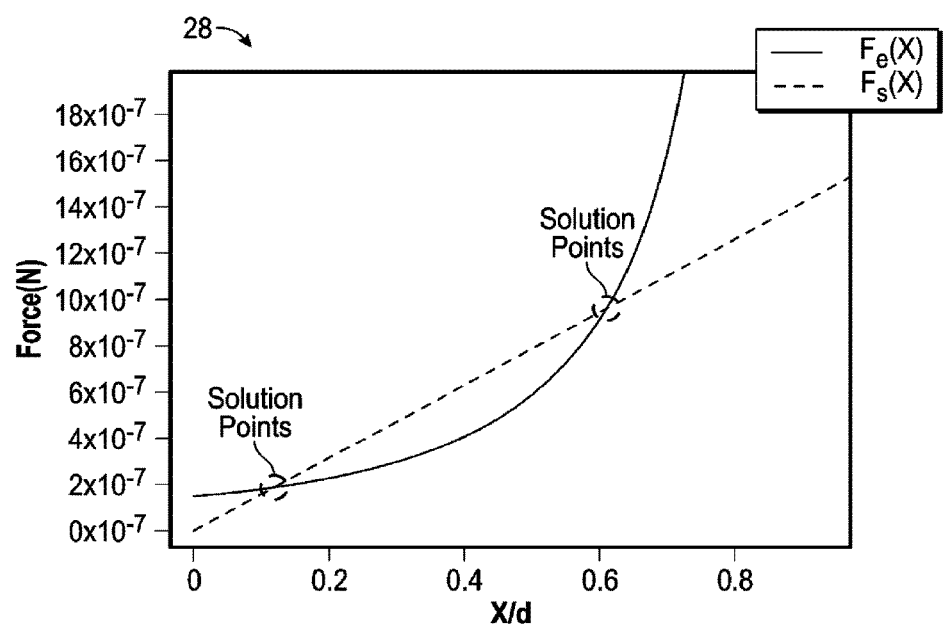
FIG. 2 illustrates a graph depicting data indicative of a graphical solution for the forces acting in a MEMS steady state, in accordance with an example embodiment.

FIG. 2 illustrates a graph 28 depicting data indicative of a graphical solution for the forces acting in a MEMS steady state, in accordance with an example embodiment. As shown in graph 28, one point is more stable than the other; thus, the upper electrode tends to stay at the nearest and most stable position.

A solution point is not considered stable unless the upper electrode 12 can maintain this position even with small force fluctuations. Mathematically, this means that a stable position can be achieved when the partial derivative of the force with respect to the displacement is less than zero, in other words $$\frac{\partial F}{\partial x_1} < 0.$$

For that reason, Equation (3) below can be obtained by taking the partial derivative of Equation (2) with respect to the displacement:

$$\frac{\varepsilon_0 A V_{MEMS}^2}{(d-x_1)^3} - k < 0 \qquad (3)$$

By combining Equations (1) and (2), it is possible to obtain the range where the upper electrode displacement is stable, thus x is limited to $$0 < x < \frac{1}{3}d.$$

If the electrode position has a displacement higher than $$\frac{d}{3},$$

it cannot be maintained as a consequence, the upper electrode 12 would collapse with the bottom electrode 14. This is a major constraint that limits operation of the upper electrode 12 to one-third of the total possible distance between the plates, d/3. Hence, the maximum voltage that can be applied to avoid a collapse between the electrode can be obtained by substituting this value into Equation (2). This voltage is known as pull-in voltage, which is given by Equation (4) below:

$$V_{pi} = \sqrt{\frac{8kd^3}{27\varepsilon_0 A}} \qquad (4)$$

Although the MEMS device is unstable at displacements greater than d/3, it is possible to obtain a correspondent voltage for each position over the total gap under the case of static equilibrium from Equation (2).

Figure 3:
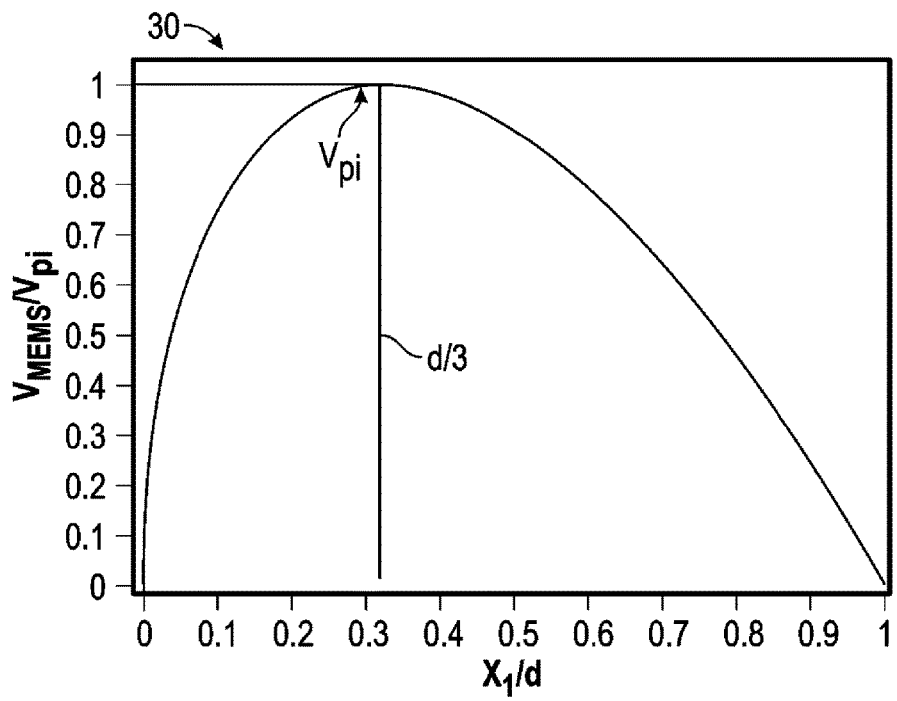
FIG. 3 illustrates a graph depicting data indicative of a normalized applied voltage in a MEMS versus a normalized upper plate position, in accordance with an example embodiment.

FIG. 3 illustrates a graph 30 depicting data indicative of a normalized applied voltage in a MEMS versus a normalized upper plate position, in accordance with an example embodiment. Graph 30 of FIG. 3 shows the applied MEMS voltage (normalized with respect to $V_{pi}$) versus the upper plate position (normalized with respect to the total gap). The maximum voltage that can be applied (neglecting the dynamics of the MEMS) is the pull-in voltage. Since the MEMS is unstable above d/3, sophisticated control such as closed-loop voltage feedback is required to maintain stable positioning of the upper plate.

The pull-in voltage depends purely on the MEMS design characteristics. For illustration purposes only, the following parameters can be assumed: k=0.3125 N/m, 0.1 mm²<A<1 mm², and 5 μm<d<500 μm. Therefore, the pull-in voltage can be manipulated over a wide range by modifying the electrode area or the distance between the plates. Although the voltage can be manipulated, the maximum displacement possible for stable operation is still d/3. This can limit the range of useful capacitance for MEMS devices. However, as will be described in greater detail, herein, the combination of a memristor and a MEMS device such as a MEMS parallel plate capacitor offers a solution.

Figures 4, 5:
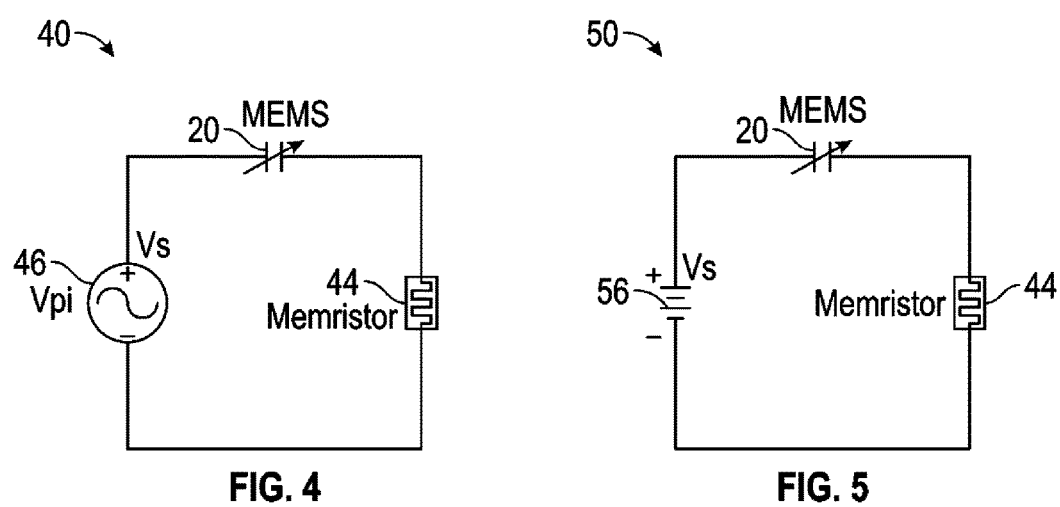
FIG. 4 illustrates a schematic diagram of a circuit composed of a memristor and a MEMS parallel plate capacitor in series with an AC input, in accordance with an example embodiment.
FIG. 5 illustrates a schematic diagram of a circuit composed of a memristor and the MEMS parallel plate capacitor in series with a DC input, in accordance with an example embodiment.

FIG. 4 illustrates a schematic diagram of a circuit 40 composed of a memristor 44 and the MEMS parallel plate capacitor 20 in series with a voltage input 46, in accordance with an example embodiment. The circuit 40 can be implemented in some context as a MEMS apparatus with dynamic control. Such an apparatus or circuit 40 includes the MEMS parallel plate capacitor integrated with and/or connected electronically to one or more memristors such as memristor 44 in a series configuration, such that a displacement is observable as a function of memristance, and wherein the position of the upper electrode 12 (shown in more detail in FIG. 1) can be interpreted in a form of a resistance rather than a capacitance. The current in the apparatus or circuit 40 is limited by the MEMS parallel plate capacitor 20, thereby restricting a change in the resistance of the memristor 44 (or multiple memristors). The memristor 44 can be utilized as a sensor element to improve the operational range of the MEMS parallel plate capacitor 20.

FIG. 5 illustrates a schematic diagram of a circuit 50 composed of a memristor 44 and the MEMS parallel plate capacitor 20 in series with a DC input 56, in accordance with an example embodiment. In an example embodiment, it can be assumed that a step input voltage of amplitude $0.8V_{pi}$ is used in order to avoid overshooting the MEMS critical displacement.

Figure 6:
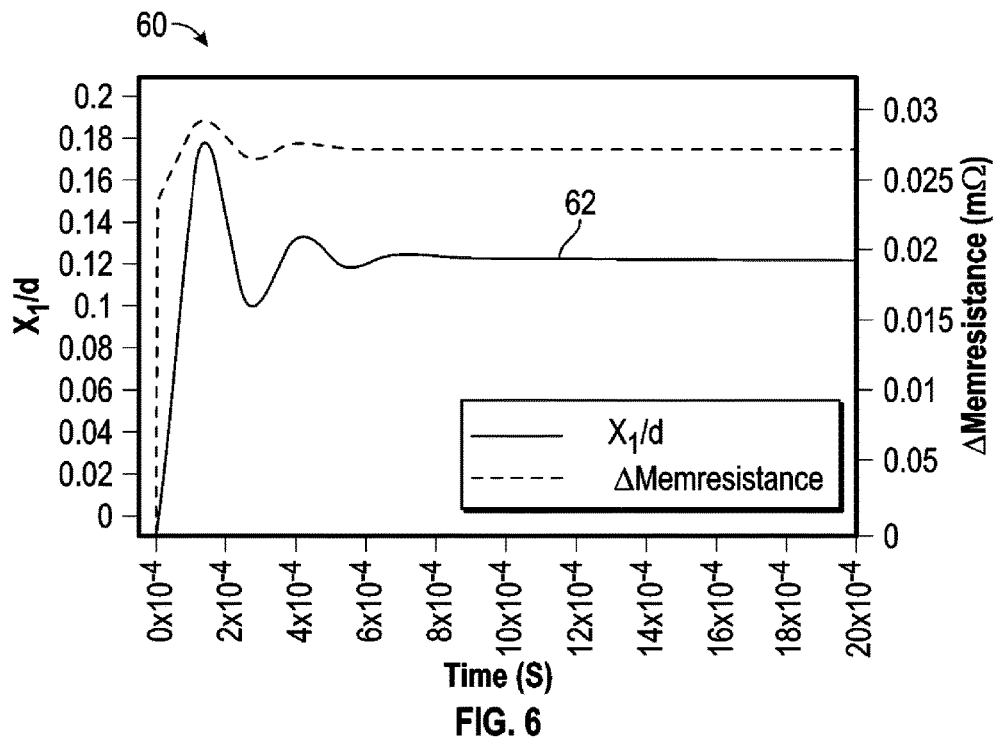
FIG. 6 illustrates a graph depicting data indicative of memristance and a normalized MEMS displacement time response with a step input voltage, in accordance with an example embodiment.

FIG. 6 illustrates a graph 60 depicting data indicative of memristance and a normalized MEMS displacement time response with a step input voltage, in accordance with an example embodiment. Graph 60 of FIG. 6 depicts the time response for the normalized MEMS displacement (solid line 62) and the memristance change with respect to the initial condition (M(0)=2,550 Ohms). Here, it is possible to observe that the MEMS upper plate oscillations have the same frequency that the memristance change indicating a coupling between the memristor 44 and the MEMS parallel plate capacitor 20. A spike in the memristance at time t=0 is observed, and this can be attributed to the abrupt voltage change when the step function is applied. In other words, the voltage observed by the memristor will change suddenly from zero to the step amplitude. The memristor 44 will change its resistance in response to this transient event.

Figure 7:
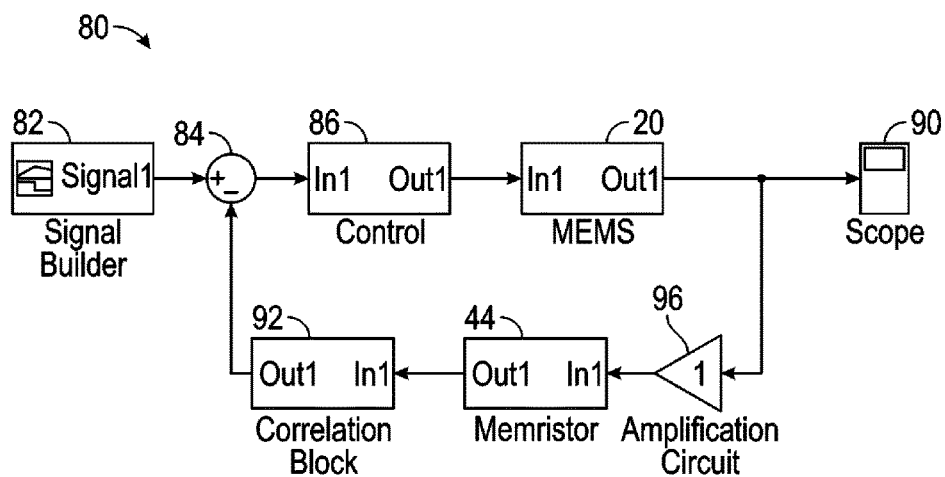
FIG. 7 illustrates a block diagram depicting a closed-loop control system with MEMS displacement utilizing a memristor acting as a sensing element, in accordance with an example embodiment.

FIG. 7 illustrates a block diagram depicting a closed-loop control system 80 with MEMS displacement utilizing the memristor 44 acting as a sensing element, in accordance with an example embodiment. The closed-loop control system 80 shown in FIG. 7 includes a signal builder 82 which provides data signals to a summation component 84, which in turn provides input to a controller 86 which provides output that is in turn fed as in input to the MEMS parallel plate capacitor 20. Data from the MEMS parallel plate capacitor 20 can be viewed via an oscilloscope 90 or other measuring device. Output from the MEMS parallel plate capacitor 20 can be provided as input to an amplification circuit 96 whose output is provided as input to the memristor 44, which in turn provides output that is fed as in put to a correlation block 92. The output from the correlation block 92 is then provided (i.e., feedback) to the summation component 84.

The closed-loop control system 80 shown in FIG. 7 is based on a pole placement design technique, wherein the memristor 44 is treated together with an amplification stage or amplification circuit 96 as the feedback element. The correlation block 92 represents a polynomial equation that correlates with the MEMS displacement (i.e., associated with MEMS parallel plate capacitor 20) and the memristance. Thus, FIG. 7 depicts a closed-loop control system 80 for MEMS displacement using the memristor 44 as a sensor element.

In the example embodiment shown in FIG. 7, a signal builder 82 sends an electrical signal to the summation point 84. Output from the summation point is sent to the controller 86. Output from the controller 86 is provided as input to the MEMS parallel plate capacitor 20. A signal from the MEMS parallel plate capacitor 20 is out to the oscilloscope 90 and also to the amplification circuit 96, which provides a signal to the memristor 44 whose output is provided as input to the correlation block 92. The output from the correlation block 92 is then provided as input to the summation block 84 along with output from the signal builder 82.

Figure 8:
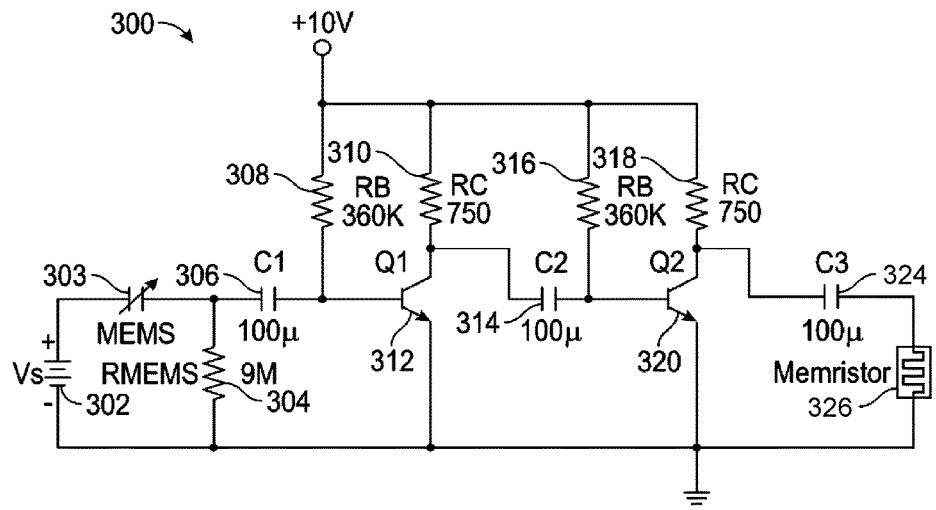
FIG. 8 illustrates a MEMS-BJT-memristor circuit, in accordance with an example embodiment.

FIG. 8 illustrates a MEMS-BJT-memristor circuit 300, in accordance with an example embodiment. The circuit 300 shown in FIG. 8 includes a power supply 302 connected to a MEMS parallel plate capacitor 303 which in turn is connected to a resistor 304 and a capacitor 306. The capacitor 306 is connected to a resistor 308 and the input to a transistor 312, which connects to a resistor 310 and a capacitor 314. A resistor 318 connects to a capacitor 320 and to resistors 308, 310, and 316. The resistor 318 also connects to the capacitor 324, which in turn is connected to a memristor 326. From the circuit configuration shown in FIG. 8, it is possible to observe that two amplifiers can be cascaded to have a significant impact on the memristance.

Figure 9:
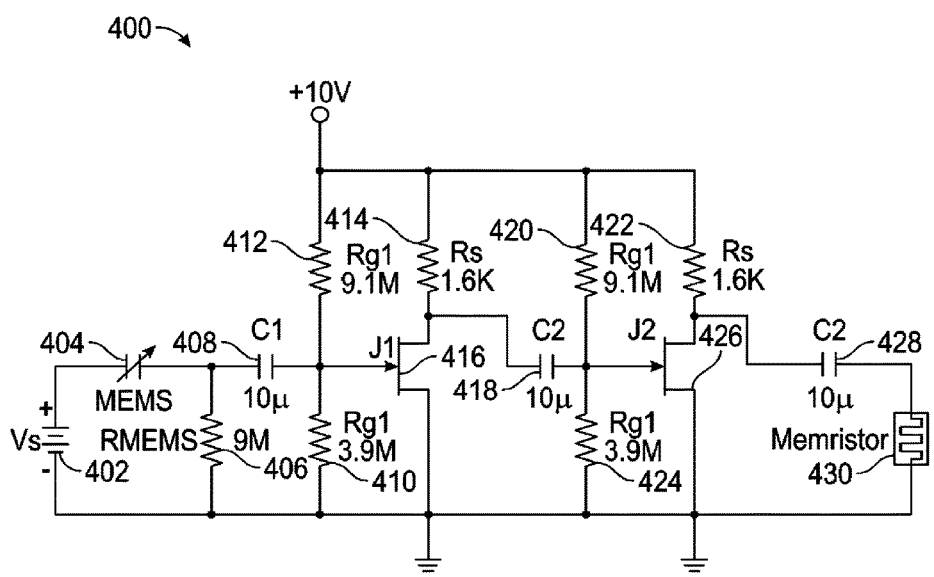
FIG. 9 illustrates a MEMS-MOSFET-memristor circuit, in accordance with an example embodiment.

FIG. 9 illustrates a MEMS-MOSFET-memristor circuit 400, in accordance with an example embodiment. The circuit 400 shown in FIG. 9 includes a power supply 402 connected to a MEMS parallel plate capacitor 404 that is connected to a resistor 406 and a capacitor 408. Resistors 412 and 410 connect to the capacitor 408 and also to the input of a MOSFET transistor 416. A resistor 414 connects to the MOSFET transistor 416 and to a capacitor 418. A resistor 420 connects to the capacitor 416, a resistor 424, and an input to a MOSFET transistor 426. A resistor 422 connects to the MOSFET transistor 426 and to a capacitor 428, which in turn connects to a memristor 430.

Similar to the BJT configuration shown in FIG. 8, the two MOSFET transistors 416 and 426 shown in FIG. 9 in cascade are required to have a significant impact on the memristance change. Thus, the resulting MOSFET amplifier of FIG. 9 has a lower gain but higher impedance compared to the BJT amplifier configuration of FIG. 8. This will result in a smaller modulation in memristance in the first regime and smaller rate of the gradual increase in the memristance in the second regime.

Figure 10:
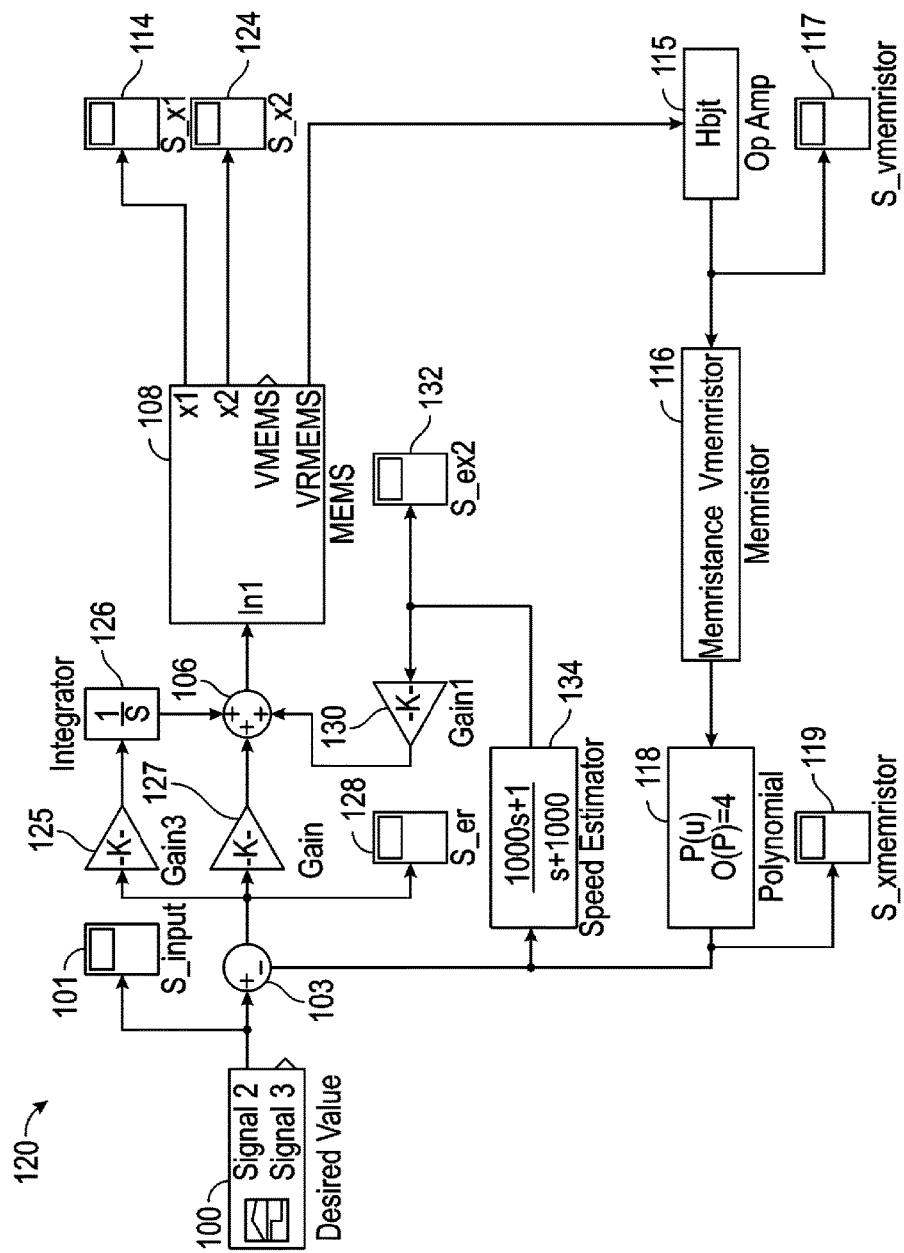
FIG. 10 illustrates a block diagram depicting a closed-loop control system based on a nonlinear MEMS model, in accordance with an example embodiment.

FIG. 10 illustrates a block diagram depicting the structure of a closed-loop control system 120, in accordance with an example embodiment. The closed-loop control system 120 can be implemented with a PID (Proportional-Integrator-Derivative) like structure. The velocity is estimated by the speed estimator operation shown at block 134 taking the derivative of the output resulting from the operation shown at block 118. The integration block 126 eliminates the stationary error. In the closed-loop control system 120, the gains can be tuned for this configuration. Thus, the closed-loop control system 120 includes a signal builder 100 that provides an electrical signal as input to an oscilloscope 101 and a summation point or circuit 103. The output from the summation point or circuit 103 can be provided as input to amplifiers 125 and 127 and also to an oscilloscope 128.

The output from the amplifier 125 can be provided as input to an integrator circuit 126 whose output is provided as input to a summation point or circuit 106. The output from amplifier 127 is also provided as input to the summation point or circuit 106. Output from the summation point or circuit 106 is provided as input to the MEMS parallel plate capacitor 108 whose output is provided as input to an operational amplifier 115 and also to oscilloscopes 114 and 124. The output from the operational amplifier 115 is provided as input to memristor 116 and also to oscilloscope 117.

Output from memristor 116 is provided as input to the correlation block 118 whose output is also provided as input to oscilloscope 119 and to a speed estimator circuit 134 and also to the summation point or circuit 103. The output from the speed estimator circuit 134 can be provided as input to an amplifier circuit 130 (i.e., gain). An oscilloscope 132 can also be connected to the output of the speed estimator circuit 134. Output from the amplifier circuit 130 can be provided to the summation point or circuit 106.

Figure 11:
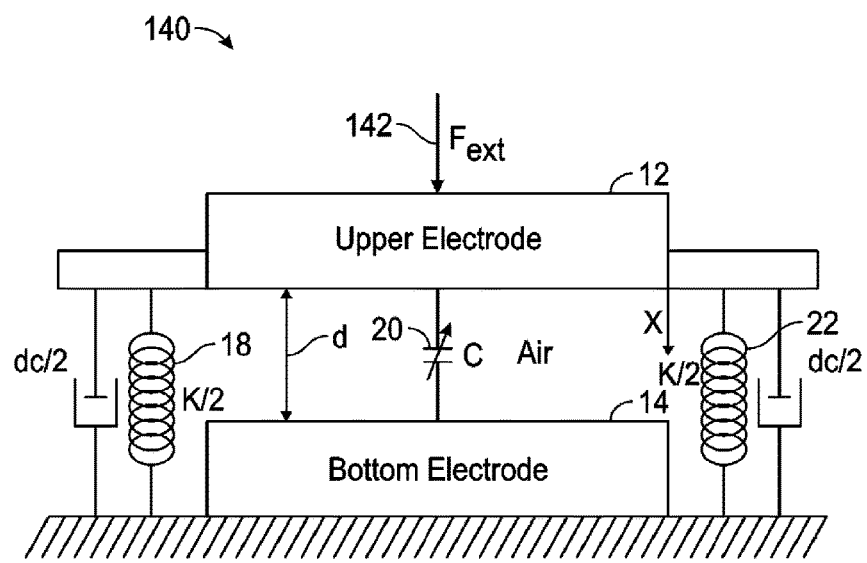
FIG. 11 illustrates a schematic diagram of a MEMS parallel plate capacitor sensor under an external force, in accordance with an example embodiment.

FIG. 11 illustrates a schematic diagram of a MEMS parallel plate capacitor sensor 140 under an external force, in accordance with an example embodiment. In the configuration shown in FIG. 11, the MEMS parallel plate capacitor sensor 140 includes an upper electrode 12 with respect to a bottom electrode 14 and an airgap therebetween. The configuration shown in FIG. 11 is similar to that depicted in FIG. 1 with the addition of the force 142 with respect to the upper electrode 12. A parallel plate MEMS capacitive sensor such the MEMS parallel plate capacitor sensor 140 depicted in FIG. 11 can be employed in a variety of applications to measure external forces.

Basically, a capacitive MEMS sensor has the same configuration as a parallel plate MEMS actuator, which offers a capacitor like structure with suspended and fixed plates. In this case, when an external force is applied to the moving plate, the gap varies creating a change in the capacitance of the MEMS sensor. This force can be an acceleration of the moving plate mass (e.g., as used in accelerometers), Coriolis force (e.g., as in gyroscopes), or external pressure. Furthermore, the application for MEMS capacitive sensors such as, for example, the MEMS parallel plate capacitor sensor 140 embodiment shown in FIG. 11 can expand to, for example, automobile air bags, navigation, instrumentation, and biomedical applications. The ability of a MEMS sensor to measure forces from mN to pN can be crucial, for example, to the understanding of the fundamental elements of biomedical systems.

As well as MEMS actuators, a MEMS capacitor sensor may be limited to the pull-in effect generated by the applied voltage in a readout configuration. Additionally, signal amplitude demodulation of the AC readout may be needed to extract the capacitance and consequently the measure force. Therefore, a closed-loop control system can be applied to the MEMS capacitive sensor.

Figure 12:
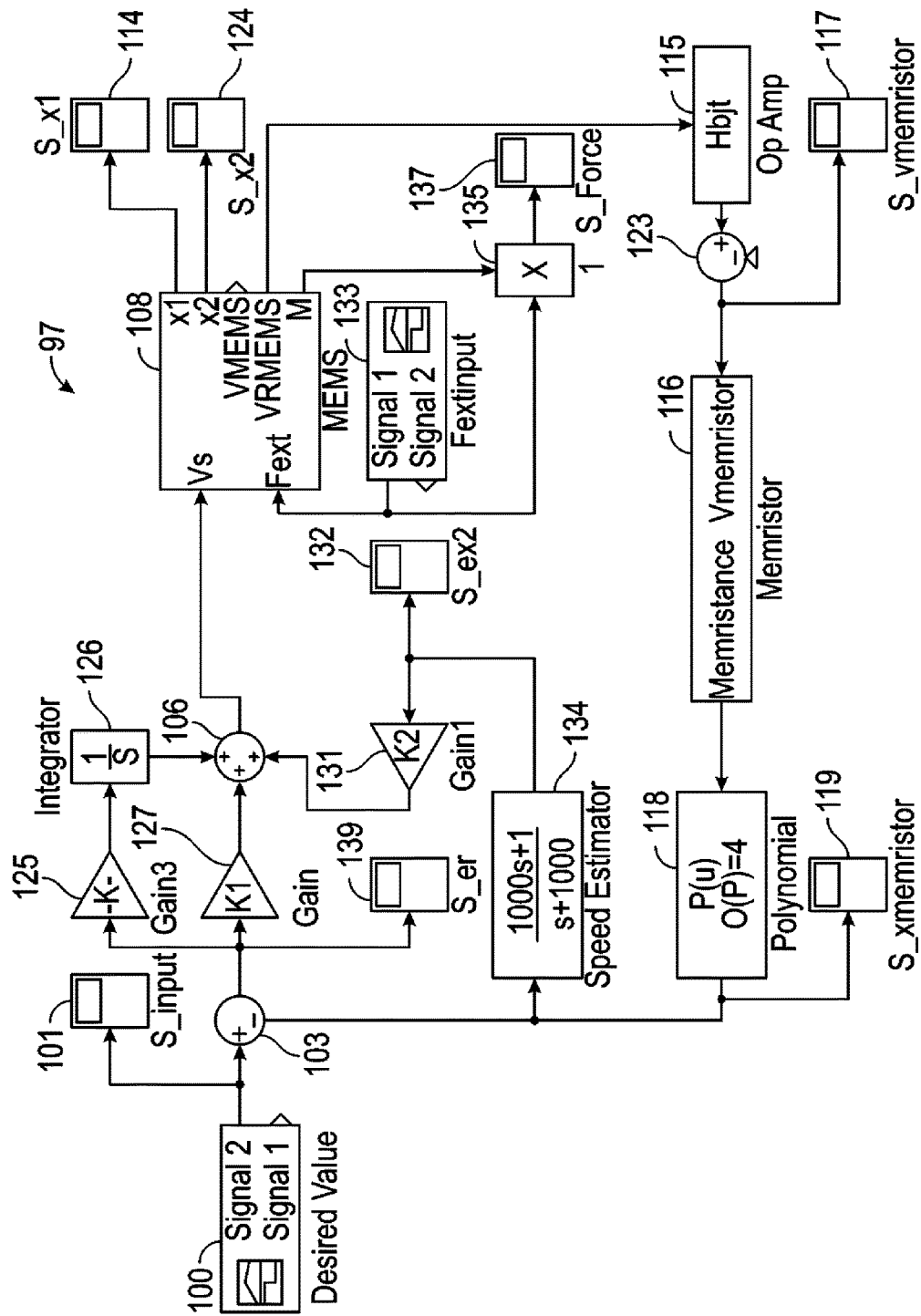
FIG. 12 illustrates a block diagram depicting a closed-loop control system based on a nonlinear MEMS model and a memristor employed as a position sensor, in accordance with an example embodiment.

FIG. 12 illustrates a block diagram of a closed loop control system 97 with an external force, in accordance with an example embodiment. The closed loop control system 97 shown in FIG. 12 includes a signal builder 100 that provides an output signal provided to a summation point or circuit 103 and an oscilloscope 101. The output from the summation or circuit 103 is then provided as input to amplifier circuits 125, 127 and the oscilloscope 139. The output from amplifier 125 is provided as input an integrator circuit 126 whose output is then fed as input to a summation point or circuit 106.

Output from the amplifier 127 is also provided as input to the summation point or circuit 106 whose output is provided as input to the MEMS parallel plate capacitor 108. The output from the MEMS parallel plate capacitor 108 is provided to oscilloscopes 114, 124 and to an operational amplifier 115 and a multiplier circuit 135. The output from the operational amplifier 115 is provided as input to a summation point or circuit 123 whose output is provided as input to a memristor 116 and also to an oscilloscope 117.

The output from the memristor 116 can be provided as input to the correlation block 118 whose output is provided as input to oscilloscope 119, the speed estimator circuit 134, and the summation point or circuit 103. An oscilloscope 132 also connects electrically with the input to an amplifier circuit 131. The output from the speed estimator circuit 134 is provided as input to the amplifier circuit 131 (i.e., gain). The output from the amplifier circuit 131 is provided as input to the summation point or circuit 106.

Additionally, an input to the multiplier circuit 135 is tied electronically to an input to the MEMS parallel plate capacitor 108 along with a signal from a block 133 that represents the external force (see FIG. 13) to be sensed. An output from the multiplier circuit 135 also connects to an oscilloscope 137.

Figure 13:
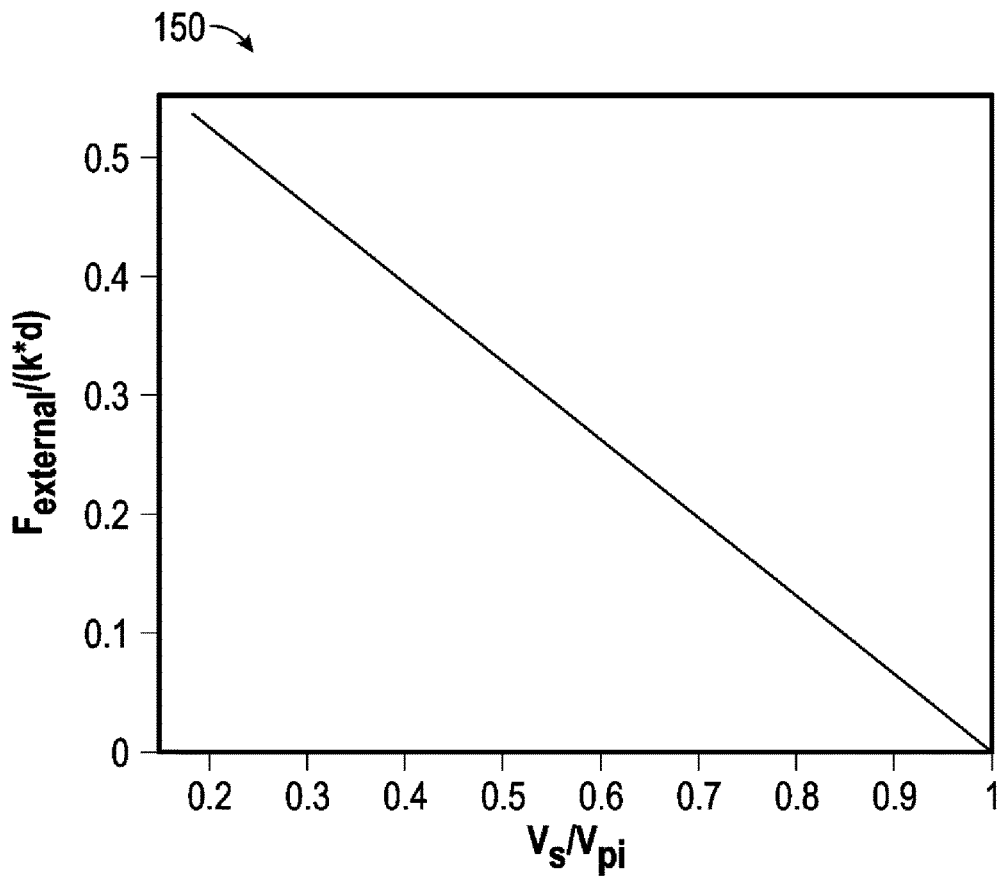
FIG. 13 illustrates a graph depicting data indicative of a linear relation between the voltage at the output of the controller versus the external force in accordance with an example embodiment.

FIG. 13 illustrates a graph 150 depicting data indicative of a linear relation between the voltages at the output of the controller versus the external force in accordance with an example embodiment. Graph 150 is a plot showing the external force versus the controller voltage $V_s$. When the MEMS is used as a sensor, the output of the summation point becomes the reading signal. In this configuration, the output voltage of the controller is linearly proportional to the sensed force. Graph 150 depicts data indicative of the memristance response to external force perturbations.

In graph 150, the slope depends on MEMS characteristics and the frequency respond depends on the gain constants of the controller. Therefore, this system can be adapted for fast response, affecting the change in the memristance, or low response with more accuracy. Thus, this system is not limited to MEMS actuator, but can be also used for MEMS sensors. For the MEMS sensor, the operation range can be improved as well the signal process can be improved and avoid ac signals.

A design is thus disclosed for a simple voltage closed-loop control system, as shown which can stabilize the MEMS upper plate position up to 95% of the total gap. A memristor such as memristor 116 can be used to measure the position of the MEMS as well to estimate the velocity closing the loop for two states of the system. The final control design eliminates the measurement of the MEMS voltage to avoid any interaction with its dynamics. In order to compensate this state, an integration block was added to minimize the stationary error. The controller can be tuned to constrain the applied voltage saving power or avoiding saturation in the memristor 116.

Several approaches for the controller design can be implemented, such as, for example, an active disturbance rejection controller (ADRC) composed of an extended state observer that estimates the system states and the external disturbance, combined with a PD controller. Another example is to use a Lyapunov-based nonlinear control, which treats the nonlinearities of the system with control Lyapunov functions and back-stepping to ensure the desired performance. All the approaches need a position (and in some cases velocity) feedback. For that reason the memristor as a sensing element and velocity estimator is not limited to one type of controller, but can be employed in a wide variety of controller designs.

Memristors have attracted much attention due to their application to non-volatile memories. Its behavior has not been limited to memristor applications in the digital field, but can be used as an analog device. The analog application branch can be expanded when the disclosed device is integrated to micro-electro-mechanical systems. More specifically, the memristor can play an important role when it is combined with, for example, electrostatic parallel plate MEMS actuators.

One of the main concerns for the parallel plate MEMS actuator is the limited motion of the upper plate to one third of the total gap before the plates collapse, reducing the MEMS functionality. There are different approaches to overcome this issue, one of the most promising is to use a voltage closed-loop control. One limitation is the complexity of the existing feedback methods making a complex system and affecting the MEMS dynamics in some cases. This work shows the potential of the memristor to measure MEMS displacement and translate it to resistance instead of capacitance based on charge transfer.

When the MEMS and the memristor are integrated in a simple series circuit configuration, it is possible to observe that the displacement can be a function of the memristance giving the possibility of interpreting the upper electrode position in the form of resistance instead of capacitance. This phenomenon was observed with sinusoidal voltage inputs, with low frequencies, and with dc step, in a transient trajectory. Equating the expression for the charge in both devices it is possible to observe the quartic relationship (i.e., a polynomial of 4th degree: quatric) between the MEMS dynamics and the memristance; indicating that the memristance intrinsically interprets the MEMS displacement in the form of resistance without any other calculation. However, this configuration has a deficiency which is the small change in the memristance due to low memristor voltage and low current flow limited by the MEMS.

Finally, a simple design for a voltage closed-loop control is presented and it is shown that the MEMS upper plate position can be stabilized up to 95% of the total gap. The memristor is used to measure the position of the MEMS as well as to estimate the velocity. In the final control design, the measurement of the MEMS voltage is avoided to prevent any side effect in the MEMS dynamics. In order to compensate for the lack of measuring this state directly and to minimize the stationary error, an integration block was added. The controller can be tuned to constrain the applied voltage saving power or avoiding saturation in the memristor; however, there is a tradeoff with the power consumption and the system performance.

These results indicate an extension to the memristor applications as well as a new method to translate the charge in the form of resistance using simpler mathematical expressions. As well, a method to improve the working range for an electrostatic MEMS actuator is presented where it can be manipulated up to 95% of the total gap with low power consumption.

Figure 14:
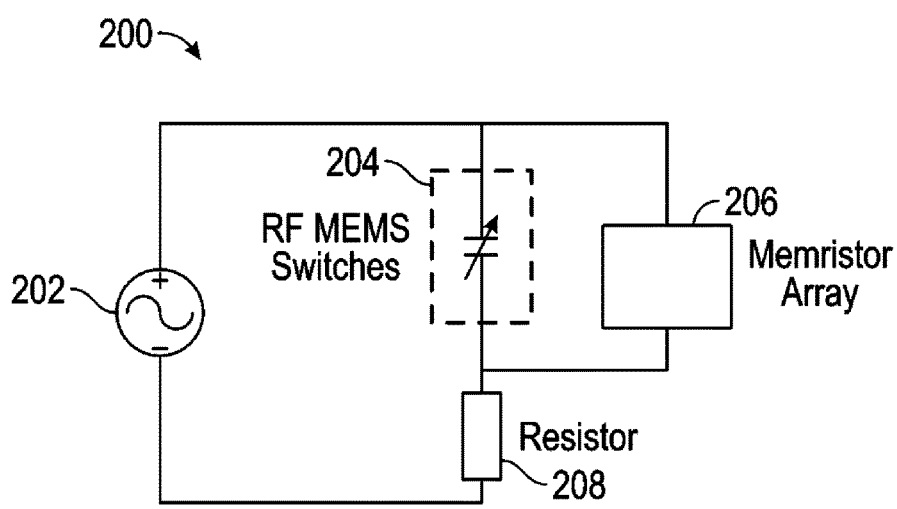
FIG. 14 illustrates a schematic diagram of a memristor array circuit utilized as a DAC to create voltage dividers, in accordance with an example embodiment.

FIG. 14 illustrates a schematic diagram of a memristor array circuit 200 utilized as a DAC to create voltage dividers, in accordance with an example embodiment. The circuit 200 is shown to indicate an alternative application of the disclosed embodiments. The memristor array circuit 200 includes a power supply 202 connected electronically with a plurality of RF MEMS switches 204, a memristor array 206, and a resistor 208 Expanding the memristor applications discussed herein, the memristor array 206 can be utilized for a digital to analog converter (DAC). Switching high and low resistance creating voltage dividers as shown in FIG. 14. A similar configuration can be implemented using memristors with combination with Op Amp. The embodiment of a DAC using memristor only as shown in FIG. 14 is unique.

Based on the foregoing, it can be appreciated that a number of embodiments, preferred and alternative are disclosed herein. For example, in a preferred example embodiment, a MEMS apparatus with dynamic displacement control can be implemented. Such an apparatus can include a MEMS parallel plate capacitor integrated with at least one memristor in a series configuration wherein a displacement is observable as a function of memristance, such that an upper electrode position is capable of being interpreted in a form of a resistance rather than a capacitance. The current in the apparatus (e.g., electrical circuit) is limited by the MEMS parallel plate capacitor restricting a change in a resistance of the memristor(s). The memristor(s) can be utilized in some embodiments as sensor element to improve the MEMS operation range.

In another example embodiment, the MEMS parallel plate capacitor and the memristor(s) can be utilized as a part of a MEMS sensor. In yet another example embodiment, the MEMS parallel plate capacitor and the memristor(s) can be employed as a part of a MEMS actuator. In still another example embodiment, the amplification stage (or stages) can maximize the charge interaction. In some example embodiments, the amplification stage(s) can include BJT amplification (e.g., see FIG. 8) while in other example embodiments the amplification stage(s) can include MOSFET amplification (e.g., see FIG. 9). In yet another example embodiment, the amplification stage(s) can include an Op Amp sage. In another example embodiment, the memristor(s) can be utilized as a sensor element for MEMS displacement for voltage close-loop control to improve the MEMS operation range.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

The invention claimed is:

1. A MEMS apparatus with dynamic displacement control, said apparatus comprising:
   a MEMS parallel plate capacitor integrated with at least one memristor in a series configuration wherein a displacement is observable as a function of memristance, such that an upper electrode position is capable of being interpreted in a form of a resistance rather than a capacitance;
   a correlation circuit that receives input from the memristor, wherein the correlation circuit represents a polynomial equation that correlates with MEMS displacement;
   a first summation circuit that receives input from the correlation circuit and a signal builder;
   a speed estimator circuit that receives input from the correlation circuit;

a second summation circuit that receives input from the first summation circuit and the speed estimator circuit and provides an input to the MEMS parallel plate capacitor;
wherein a current in said apparatus is limited by said MEMS parallel plate capacitor restricting a change in a resistance of said at least one memristor; and
wherein said at least one memristor is employable as a sensor element to improve a MEMS operation range.

2. The apparatus of claim 1 wherein said MEMS parallel plate capacitor and said at least one memristor is employed as a part of a MEMS sensor.

3. The apparatus of claim 1 wherein said MEMS parallel plate capacitor and said at least one memristor is employed as a part of a MEMS actuator.

4. The apparatus of claim 1 wherein further comprising at least one amplification stage that maximizes a charge interaction.

5. The apparatus of claim 4 wherein said at least one amplification stage comprises a BJT amplification.

6. The apparatus of claim 4 wherein said at least one amplification stage comprises via a MOSFET amplification.

7. The apparatus of claim 4 wherein said at least one amplification stage comprises an Op Amp stage.

8. The apparatus of claim 1 wherein said at least one memristor is employable as said sensor element for a MEMS displacement for voltage close-loop control to improve said MEMS operation range.

9. A MEMS apparatus with dynamic displacement control, said apparatus comprising:
a MEMS parallel plate capacitor integrated with at least one memristor in a series configuration wherein a displacement is observable as a function of memristance, such that an upper electrode position is capable of being interpreted in a form of a resistance rather than a capacitance;
a correlation circuit that receives input from the memristor, wherein the correlation circuit represents a polynomial equation that correlates with MEMS displacement;
a first summation circuit that receives input from the correlation circuit and a signal builder;
a speed estimator circuit that receives input from the correlation circuit;
a second summation circuit that receives input from the first summation circuit and the speed estimator circuit and provides an input to the MEMS parallel plate capacitor;
at least one amplification stage of said apparatus that maximizes a charge interaction;
wherein a current in said apparatus is limited by said MEMS parallel plate capacitor restricting a change in a resistance of said at least one memristor; and
wherein said at least one memristor is employable as a sensor element to improve a MEMS operation range.

10. The apparatus of claim 9 wherein said MEMS parallel plate capacitor and said at least one memristor is employed as a part of a MEMS sensor.

11. The apparatus of claim 9 wherein said MEMS parallel plate capacitor and said at least one memristor is employed as a part of a MEMS actuator.

12. The apparatus of claim 9 wherein said at least one amplification stage comprises a BJT amplification.

13. The apparatus of claim 9 wherein said at least one amplification stage comprises via a MOSFET amplification.

14. The apparatus of claim 9 wherein said at least one amplification stage comprises an Op Amp stage.

15. The apparatus of claim 9 wherein said at least one memristor is employable as said sensor element for a MEMS displacement for voltage close-loop control to improve said MEMS operation range.

16. A MEMS apparatus with dynamic displacement control, said apparatus comprising:
a MEMS parallel plate capacitor integrated with at least one memristor in a series configuration wherein a displacement is observable as a function of memristance, such that an upper electrode position is capable of being interpreted in a form of a resistance rather than a capacitance;
a correlation circuit that receives input from the memristor, wherein the correlation circuit represents a polynomial equation that correlates with MEMS displacement;
a first summation circuit that receives input from the correlation circuit and a signal builder;
a speed estimator circuit that receives input from the correlation circuit;
a second summation circuit that receives input from the first summation circuit and the speed estimator circuit and provides an input to the MEMS parallel plate capacitor;
at least one amplification stage of said apparatus that maximizes a charge interaction;
wherein a current in said apparatus is limited by said MEMS parallel plate capacitor restricting a change in a resistance of said at least one memristor;
wherein said at least one memristor is employable as a sensor element to improve a MEMS operation range; and
wherein said at least one memristor comprises said sensor element for a MEMS displacement for voltage close-loop control to improve said MEMS operation range.

17. The apparatus of claim 16 wherein said MEMS parallel plate capacitor and said at least one memristor is employed as a part of a MEMS sensor.

18. The apparatus of claim 16 wherein said MEMS parallel plate capacitor and said at least one memristor is employed as a part of a MEMS actuator.

19. The apparatus of claim 16 wherein said at least one amplification stage comprises a BJT amplification.

20. The apparatus of claim 16 wherein said at least one amplification stage comprises via a MOSFET amplification.

* * * * *